United States Patent
Seliskar et al.

[11] Patent Number: 6,115,233
[45] Date of Patent: *Sep. 5, 2000

[54] INTEGRATED CIRCUIT DEVICE HAVING A CAPACITOR WITH THE DIELECTRIC PERIPHERAL REGION BEING GREATER THAN THE DIELECTRIC CENTRAL REGION

[75] Inventors: John J. Seliskar; Derryl D. J. Allman; John W. Gregory; James P. Yakura, all of Colorado Springs, Colo.; Dim Lee Kwong, Austin, Tex.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/673,655

[22] Filed: Jun. 28, 1996

[51] Int. Cl.$^7$ .......................... H01G 4/005; H01G 4/228
[52] U.S. Cl. ...................... 361/303; 361/306.1; 361/313; 257/296
[58] Field of Search ..................................... 257/295–296, 257/300, 306–311, 528–529, 532; 361/303–305, 306.1–306.3, 310–313, 321.1, 321.2–321.5

[56] References Cited

U.S. PATENT DOCUMENTS

| | | |
|---|---|---|
| 4,793,895 | 12/1988 | Kaanta et al. . |
| 4,849,854 | 7/1989 | Eguchi .................................... 361/313 |
| 5,036,015 | 7/1991 | Sandhu, et al. . |
| 5,057,447 | 10/1991 | Paterson .................................... 437/43 |
| 5,081,421 | 1/1992 | Miller et al. . |
| 5,151,584 | 9/1992 | Ebbing et al. . |
| 5,160,987 | 11/1992 | Pricer et al. ............................ 257/307 |
| 5,169,491 | 12/1992 | Doan . |
| 5,196,353 | 3/1993 | Sandhu et al. . |
| 5,222,329 | 6/1993 | Yu . |
| 5,240,552 | 8/1993 | Yu et al. . |
| 5,245,790 | 9/1993 | Jerbic . |
| 5,245,794 | 9/1993 | Salugsugan . |
| 5,246,884 | 9/1993 | Jaso et al. .............................. 437/225 |
| 5,265,378 | 11/1993 | Rostoker . |
| 5,272,115 | 12/1993 | Sato . |
| 5,302,233 | 4/1994 | Kim et al. ............................... 156/636 |
| 5,306,935 | 4/1994 | Esquivel et al. ........................ 257/315 |
| 5,308,438 | 5/1994 | Cote et al. . |
| 5,310,455 | 5/1994 | Pasch et al. . |
| 5,321,304 | 6/1994 | Rostoker . |
| 5,330,931 | 7/1994 | Emesh et al. ............................ 437/60 |
| 5,337,015 | 8/1994 | Lustig et al. . |
| 5,354,712 | 10/1994 | Ho et al. ................................. 437/195 |
| 5,356,826 | 10/1994 | Natsume ................................. 437/60 |
| 5,362,669 | 11/1994 | Boyd et al. .............................. 437/67 |
| 5,389,194 | 2/1995 | Rostoker et al. . |

(List continued on next page.)

FOREIGN PATENT DOCUMENTS

| | | | |
|---|---|---|---|
| 0374971 | 12/1988 | European Pat. Off. | ...... H01L 25/065 |
| 0557937 | 9/1993 | European Pat. Off. | .... H01L 21/3205 |

*Primary Examiner*—Kristine Kincaid
*Assistant Examiner*—Anthony Dinkins

[57] ABSTRACT

The present invention relates to a semiconductor device, preferably a capacitor, and a method of forming the same. The method adds only a single additional masking step to the fabrication process and reduces problems relating to alignment of various layers. A relatively thick insulation layer is formed over a bottom electrode. An opening having a sidewall that is etched in the insulation layer using a mask to expose a portion of the bottom electrode. Once the mask is removed, a dielectric layer and conductive layer are then sequentially deposited over the entire structure, including sidewalls. Thereafter, chemical-mechanical polishing is used to remove portions of the conductive layer and the dielectric layer so that the conductive layer and dielectric layer which remains forms, for example, the top electrode and dielectric layer of the integrated circuit capacitor. The top electrode is thus disposed above a central region which remains of the dielectric layer and between a peripheral region which remains of the dielectric layer.

25 Claims, 10 Drawing Sheets

U.S. PATENT DOCUMENTS

| | | | |
|---|---|---|---|
| 5,395,801 | 3/1995 | Doan et al. | 437/225 |
| 5,399,234 | 3/1995 | Yu et al. | |
| 5,403,228 | 4/1995 | Pasch. | |
| 5,405,806 | 4/1995 | Pfeister et al. | |
| 5,422,289 | 6/1995 | Pierce | 437/32 |
| 5,439,551 | 8/1995 | Meikle et al. | |
| 5,452,178 | 9/1995 | Emesh et al. | 361/303 |
| 5,479,316 | 12/1995 | Smrtic et al. | 361/322 |
| 5,483,568 | 1/1996 | Yano et al. | |
| 5,492,594 | 2/1996 | Burke et al. | |
| 5,516,400 | 5/1996 | Pasch et al. | |
| 5,531,861 | 7/1996 | Yu et al. | |
| 5,559,428 | 9/1996 | Li et al. | |
| 5,561,541 | 10/1996 | Sharp et al. | |
| 5,595,526 | 1/1997 | Yau et al. | |
| 5,597,442 | 1/1997 | Chen et al. | |
| 5,624,304 | 4/1997 | Pasch et al. | |
| 5,626,715 | 5/1997 | Rostoker. | |
| 5,637,185 | 6/1997 | Murarka et al. | |
| 5,639,388 | 6/1997 | Kimura et al. | |
| 5,643,046 | 7/1997 | Katakabe et al. | |
| 5,643,050 | 7/1997 | Chen. | |
| 5,644,221 | 7/1997 | Li et al. | |
| 5,647,952 | 7/1997 | Chen. | |
| 5,658,183 | 8/1997 | Sandhu et al. | |
| 5,660,672 | 8/1997 | Li et al. | |
| 5,663,797 | 9/1997 | Sandhu. | |
| 5,664,987 | 9/1997 | Renteln. | |
| 5,667,424 | 9/1997 | Pan. | |
| 5,667,433 | 9/1997 | Mallon. | |
| 5,667,629 | 9/1997 | Pan et al. | |
| 5,668,063 | 9/1997 | Fry et al. | |
| 5,670,410 | 9/1997 | Pan. | |
| 5,672,091 | 9/1997 | Takahashi et al. | |
| 5,674,784 | 10/1997 | Jang et al. | |
| 5,695,660 | 12/1997 | Litvak. | |
| 5,700,180 | 12/1997 | Sandhu et al. | |
| 5,705,435 | 1/1998 | Chen. | |
| 5,708,559 | 1/1998 | Brabazon et al. | 361/313 |
| 5,710,076 | 1/1998 | Dai et al. | |
| 5,712,185 | 1/1998 | Tsai et al. | |
| 5,722,875 | 3/1998 | Iwashita et al. | |
| 5,741,171 | 4/1998 | Sarfary et al. | |
| 5,777,739 | 7/1998 | Sandhu et al. | |
| 5,861,055 | 1/1999 | Allman et al. | |
| 5,865,666 | 2/1999 | Nagahara. | |
| 5,868,608 | 2/1999 | Allman et al. | |
| 5,882,251 | 3/1999 | Berman et al. | |
| 5,888,120 | 3/1999 | Doran. | |
| 5,893,756 | 4/1999 | Berman et al. | |
| 5,931,719 | 8/1999 | Nagahara et al. | |
| 5,948,697 | 9/1999 | Hata. | |
| 5,957,757 | 9/1999 | Berman. | |

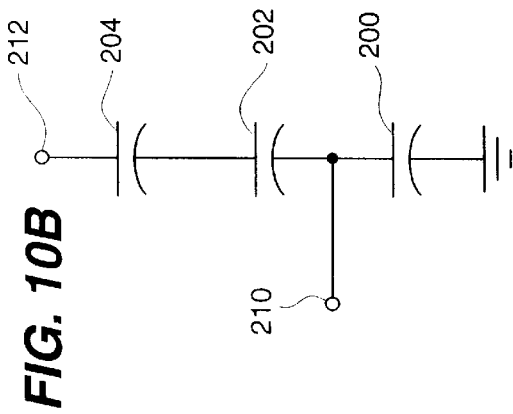
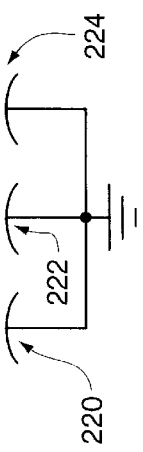
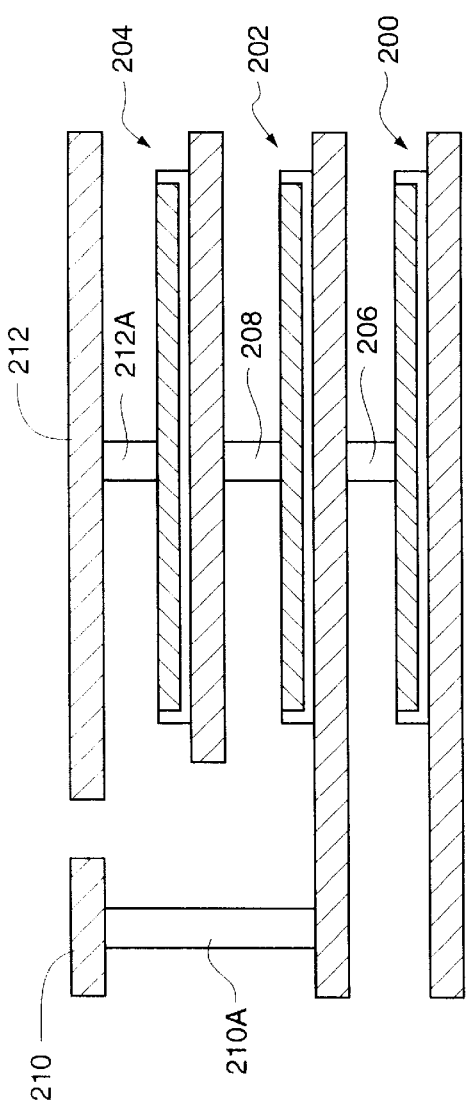
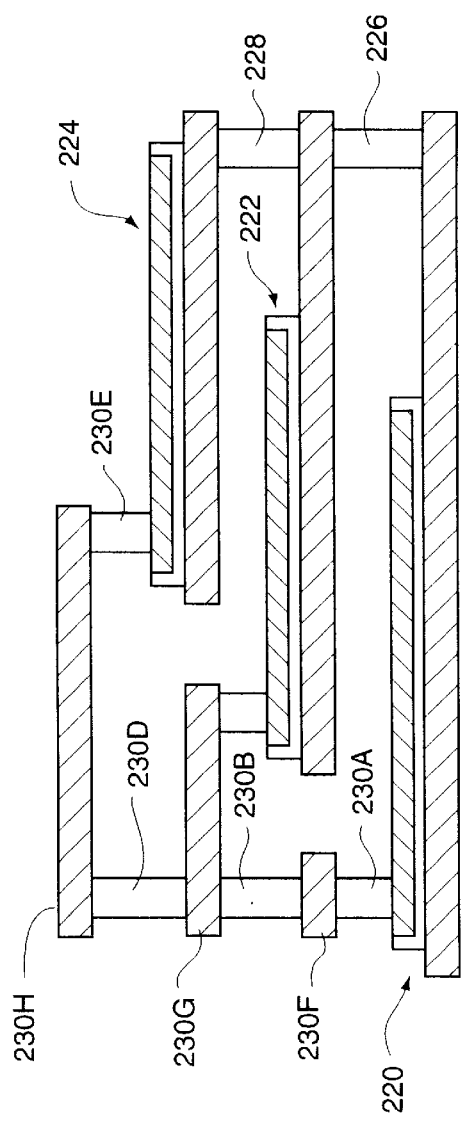

INTEGRATED CIRCUIT DEVICE HAVING A CAPACITOR WITH THE DIELECTRIC PERIPHERAL REGION BEING GREATER THAN THE DIELECTRIC CENTRAL REGION

BACKGROUND OF THE INVENTION

1. Field of the Invention

The present invention relates to an integrated circuit device, preferably a capacitor, and a method of making the same, and, more particularly, an integrated circuit capacitor for mixed signal applications that is made using chemical mechanical polishing.

2. Background Information

Capacitors are necessary for many analog and digital integrated circuit applications. Further, certain applications require series parallel combinations of integrated circuit capacitors. One such application is mixed signal applications, in which switched and capacitor filter, analog-to-digital or digital-to-analog converters, charge distribution networks or analog or sampled data functions are performed on an integrated circuit chip.

While there are many known techniques for forming integrated circuit capacitors, such techniques are characterized by the use of plural numbers of mask steps. Such mask steps inherently create undesired alignment variables such that the fabrication of integrated circuit chips containing integrated circuit capacitors is very difficult as well as increase product cost. Further, fabrication of integrated circuit capacitors using known methods also tends to result in other undesired characteristics, such as surface topologies having peaks and valleys which make the proper formation of subsequent layers difficult. For example, the formation of a subsequent metal patterning layer over a surface having peaks and valleys tends to cause inconsistencies in the individual conductive paths that are part of the metal patterning layer. Further, formation of conventional capacitors tends to adversely impact on thermal considerations, especially for devices operating in the deep submicron region. While methods are known to overcome certain of these undesired characteristics, such as the topology problem noted above, such conventional methods tend to be overly complicated and, as a result, difficult to practically implement and/or undesireably expensive to implement.

Further, other circuit devices having formation characteristics similar to that of integrated circuit capacitors also suffer from many of the same fabrication problems.

SUMMARY OF THE INVENTION

One object of the present invention is to provide a simple method of forming an integrated circuit device, preferably a capacitor.

Another object of the present invention is to provide a method of forming an integrated circuit device that adds only a single additional masking step to the fabrication process and reduces problems relating to alignment of various layers.

It is another object of the present invention to use chemical-mechanical polishing to assist in the formation of a self-aligned integrated circuit device.

It is still a further object of the present invention to obtain an integrated circuit capacitor, as well as other integrated circuit devices, which can be embedded at various layers of the integrated semiconductor chip.

It is still another object of the present invention to obtain integrated circuit capacitors that can be isolated from and stacked on top of each other on the same integrated semiconductor chip, and made by simply repeating the method used to form the device.

In order to attain the above recited objects of the present invention, among others, the method of forming an integrated circuit capacitor according to the present invention forms a relatively thick insulation layer over a bottom electrode. An opening having a sidewall that is etched in the insulation layer using a mask to expose a portion of the bottom electrode. Once the mask is removed, a dielectric layer and conductive layer are then sequentially deposited over the entire structure, including sidewalls. Thereafter, chemical-mechanical polishing is used to remove portions of the conductive layer and the dielectric layer so that the conductive layer and dielectric layer which remains forms the top electrode and dielectric layer of the integrated circuit capacitor. The top electrode is thus disposed above a central region of the dielectric layer and between a peripheral region which remains of the dielectric layer.

With this method, an integrated circuit capacitor results that can be embedded at various levels, as desired by the designer. Further, by repeating the application of dielectric, conductive and semiconductive layers prior to the step of chemical mechanical polishing, various other integrated circuit device structures, such as floating gate devices or diodes, can also be fabricated.

Furthermore, an integrated circuit capacitor or other integrated circuit device can be embedded at different desired locations in the integrated semiconductor chip, as well as be stacked on top of each other, by simply repeating the fabrication method at a different layer. Thus, the capacitor can be connected to various types of integrated circuit devices, for example resistors, diodes, and transistors, such as MOS or TFT types.

BRIEF DESCRIPTION OF THE DRAWINGS

These and other advantages of the present invention may be appreciated from studying the following detailed description of the preferred embodiment together with the drawings in which:

FIGS. 10A and 10B illustrate a cross sectional view and schematic, respectively, of integrated circuit capacitors according to the present invention formed on different levels and connected in series; and FIGS. 11A and 11B illustrate a cross sectional view and schematic, respectively, of integrated circuit capacitors according to the present invention formed on different levels and connected in parallel.

DETAILED DESCRIPTION OF THE PREFERRED EMBODIMENT

Figure 1:
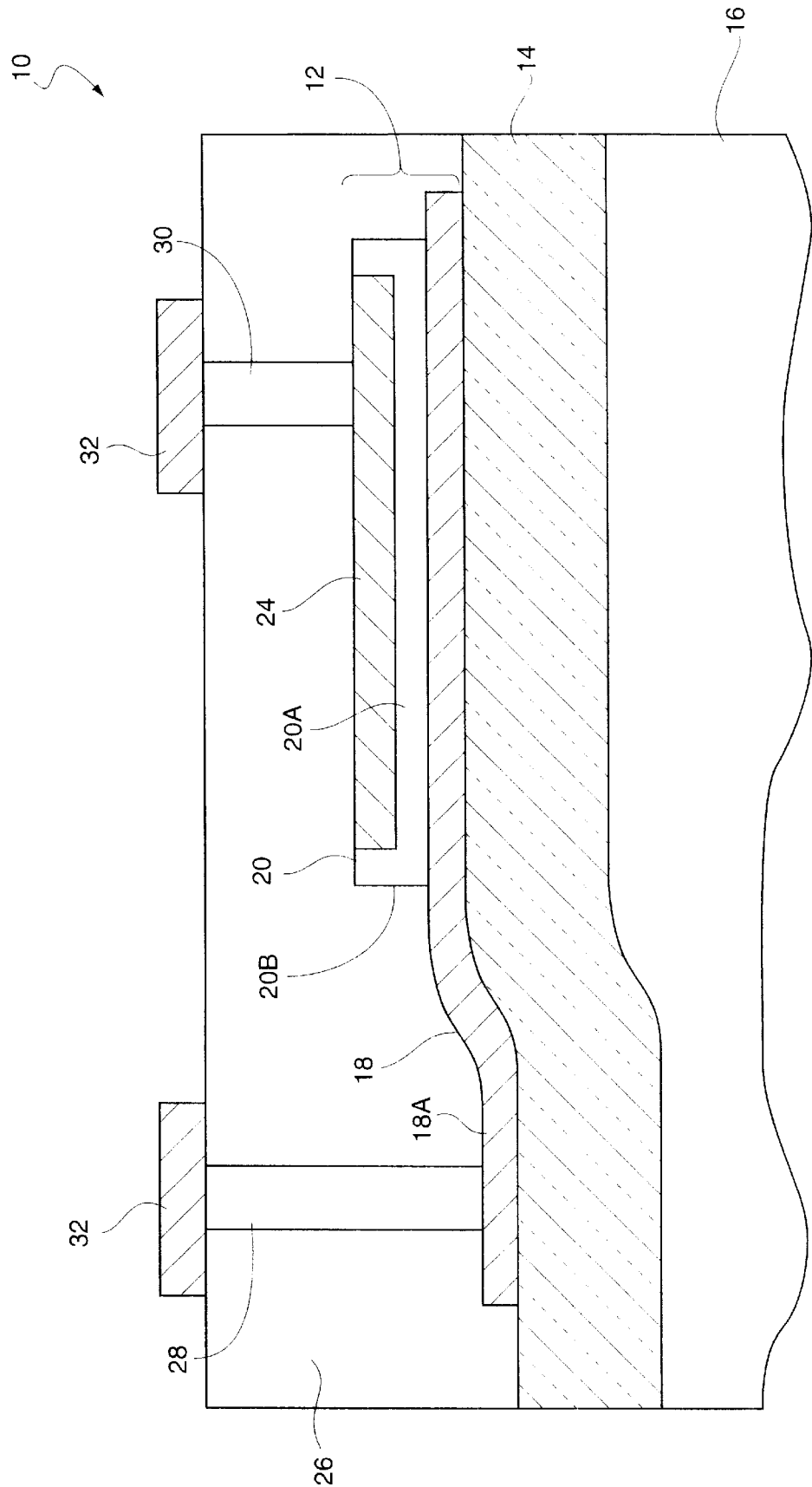
FIG. 1 illustrates a cross sectional view of one embodiment of the integrated circuit capacitor according to the present invention.

FIG. 1 illustrates a cross sectional view of one embodiment of the integrated circuit capacitor according to the present invention. The portion of integrated circuit 10 that is illustrated shows the integrated circuit capacitor 12 according to the present invention being embedded on a dielectric 14 that is deposited over a substrate or underlying film 16. It should be noted that formation of capacitors as described above, during the later stages of the chip fabrication process, advantageously allows for use of a thicker insulating dielectric layer 14, which lowers coupling capacitance to the substrate. Also, the same drawing reference numerals will be used when describing the same or similar structure in different drawing figures.

A bottom electrode 18 made from an appropriate conductor such as polysilicon, metal or superconductive material is disposed over a portion of the dielectric 14. For present photo and etch design rules, bottom electrode 18 will typically be about 4 μm×1 μm to 1,000 μm×1,000 μm and have a thickness of about 2,000 to 7,000 Angstroms. A capacitor dielectric 20 is positioned over a portion of the bottom electrode 18. Capacitor dielectric 20 is preferably a high dielectric constant insulator such as tantalum pentoxide ($TaO_5$), however silicon nitride, plasma oxides and other insulators, including composite dielectric, dielectrics with a graded dielectric constant, or ferroelectric dielectric materials could be used as well. A portion 18A of the bottom electrode 18 is not covered by the capacitor dielectric 20 so that electrical contact with contact vias can be established, as will be discussed hereafter.

The capacitor dielectric 20 contains a central region 20A that is substantially planar and will typically be 4 μm×1 μm to 1,000 μm×1,000 μm and about 300 to 1,000 Angstroms thick, although the thickness will vary according to the desired capacitive characteristics of the capacitor 12. Also included is a peripheral portion 20B that has a predetermined height above the central region 20A. This height is typically about 2,000 to 7,000 Angstroms and its width is dependent on the thickness of central region 20A. Disposed above the central region 20A and within said peripheral region 20B is a top electrode 24 made from an appropriate conductor such as polysilicon, metal or superconductive material and which will typically have a thickness of about 2,000 to 7,000 Angstroms.

Disposed on the sides and on top of the capacitor 12 is an insulator 26, which is preferably a material having a low dielectric constant, such as LTOPSG, BPSG, TEOS, or a spin on glass (SOG) material. Contact vias 28 and 30 electrically connect the bottom electrode 18 and top electrode 24, respectively, to a patterned wiring layer 32, preferably a metal such as aluminum or tungsten, disposed above the capacitor 12.

The process of forming the integrated circuit capacitor of FIG. 1 will now be described with reference to FIGS. 2 and 3A–3F.

Figure 2:
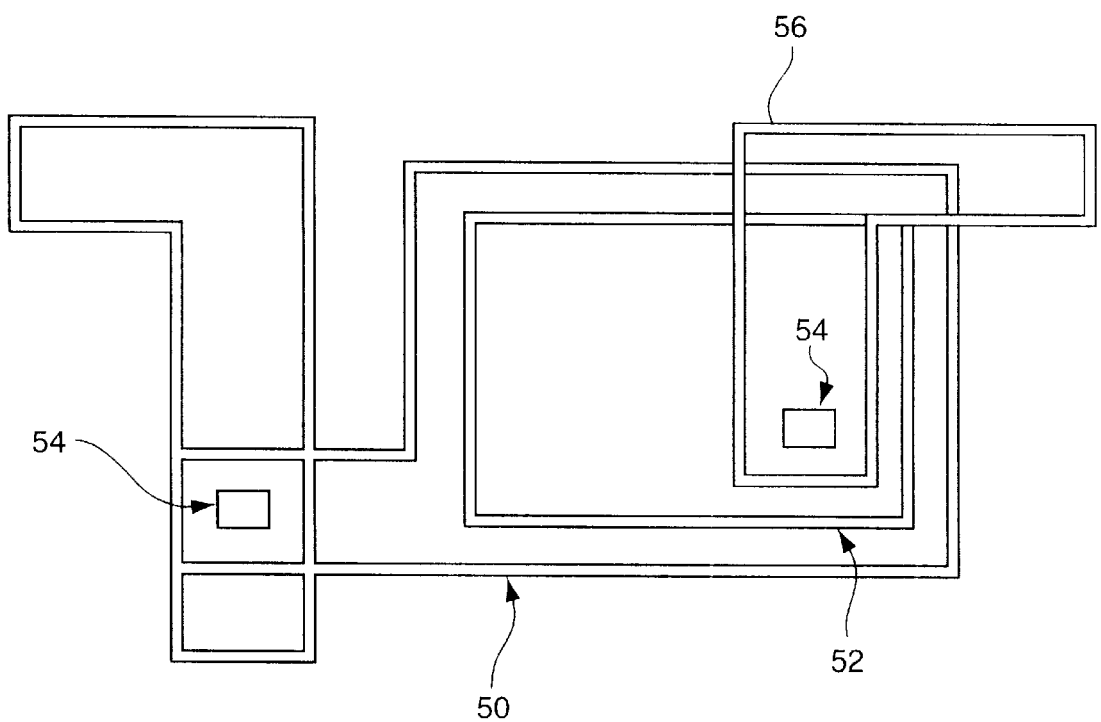
FIG. 2 illustrates a top view of different masks used to produce the integrated circuit capacitor according to the present invention illustrated in FIG. 1.

FIG. 2 illustrates the mask levels used to produce the capacitor 12 illustrated in FIG. 1. Four different masks 50, 52, 54 and 56 are required to make this structure, assuming that the levels below the bottom electrode 18 of FIG. 1 have already been made. It should be noted that only one mask in addition to those typically used for structures that do not include capacitors is required.

Figure 3A:
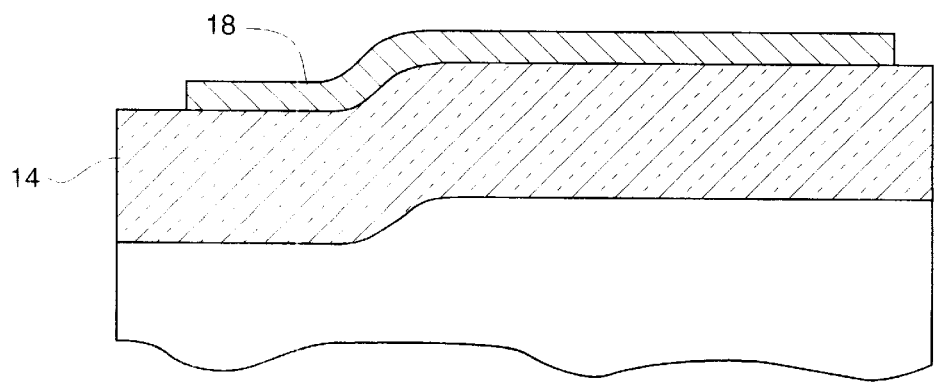
FIGS. 3A–3F illustrates various steps in the process of forming the integrated circuit capacitor according to the present invention illustrated in FIG. 1.

Mask 50 illustrated in FIG. 2 is used to obtain the bottom electrode 18 as shown in FIG. 3A, bottom electrode 18 is formed on insulator 14. Mask 50 will not typically be an additional mask, since such a mask is typically used to obtain other lower level conductors. Thus, bottom electrode can also be formed to provide for the formation of electrode 18 and other similar electrodes if desired.

Figure 3B:
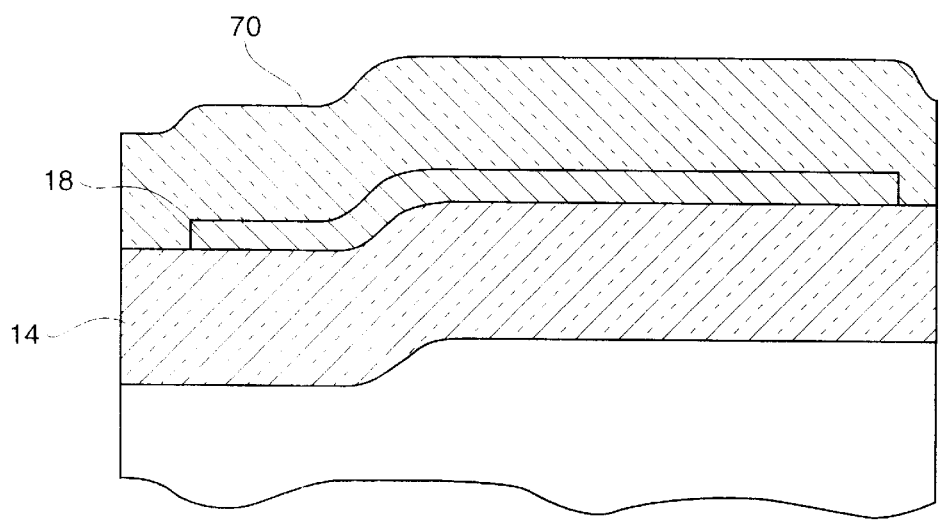

FIG. 3B illustrates the formation of insulation layer 70, which will become a portion of insulator 26 illustrated in FIG. 1. This layer is deposited over the whole surface and no masking is required.

Figure 3C:
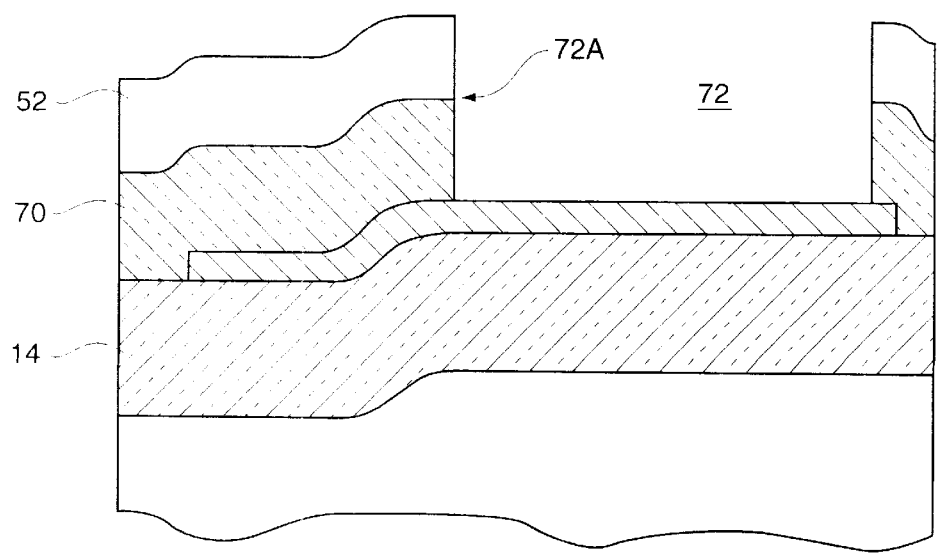

FIG. 3C illustrates the formation of an opening 72 that is made in the insulation layer 70 such that a portion of the top surface of bottom electrode 18 is exposed. Opening 72 is made using an ion beam etch, an isotropic (wet) chemical or an anisotropic plasma reactive ion etch, depending on step coverage constraints and other design variables, and requires the use of mask 52 illustrated in FIG. 2 to define the dimensions of opening 72.

Figure 3D:
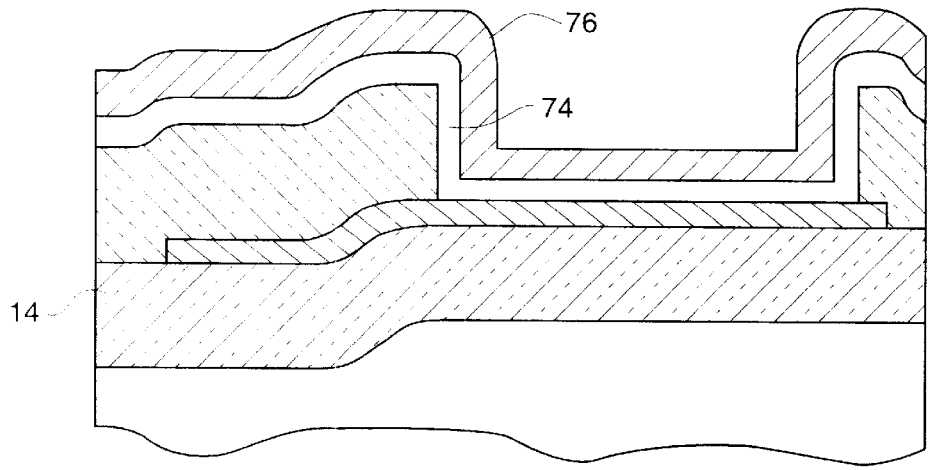

FIG. 3D illustrates formation of intermediate film 74 (which will subsequently be etched to form the capacitor dielectric 20 illustrated in FIG. 1) and a conductive layer 76 (which will subsequently be polished to form the top electrode 24 illustrated in FIG. 1) over the exposed surfaces, including sidewall 72A of opening 72, illustrated in FIG. 3C, These materials are deposited after the mask 52 is removed and no additional mask is required for this deposition.

Figure 3E:
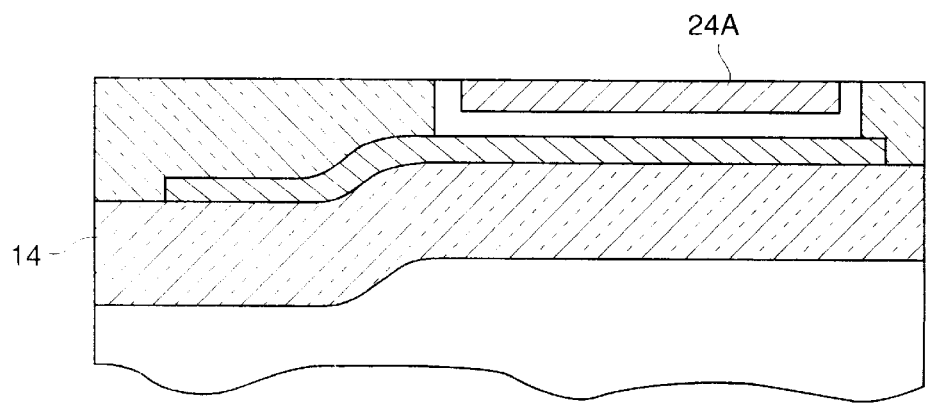

FIG. 3E illustrates the use of chemical mechanical polishing to polish the structure obtained in FIG. 3D until the entire surface is planar and coincides with the top planar surface 24A of the top electrode 24 that results from the etching of conductive layer 76. One of two or more CMP passes can be made to obtain desired polishing of the dielectric and electrode materials. It should be noted that the use of chemical mechanical polishing reduces exposure of the capacitor dielectric 20 to moisture, which allows ferroelectric dielectric materials to be used, as previously noted. However, other etch-back processes can be used, although a chemical mechanical polishing is presently preferred.

Figure 3F:
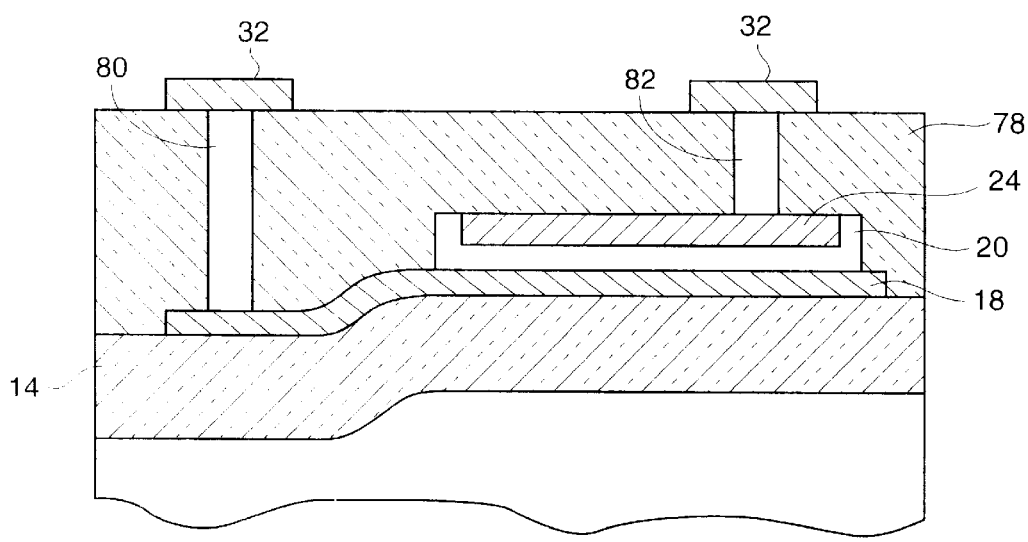

FIG. 3F illustrates the formation of an insulation layer 78, which forms another portion of insulator 26 illustrated in FIG. 1, Insulation layer 78 will typically be the same material as insulation layer 70 illustrated in FIG. 3B and be a relatively thick dielectric. Thereafter, mask 54 illustrated in FIG. 2 is applied and a chemical or reactive ion etch is used depending on the material to establish passages 80 and 82 illustrated in FIG. 3F that will eventually be filled with a conductive material to establish contact vias 28 and 30 illustrated in FIG. 1. The conductive material used to establish contact vias 28 and 30 can be the same as the metal layer used to establish patterned wiring layer 32 illustrated in FIG. 1. Alternatively, chemical-mechanical polishing using tungsten plugs can be used to establish passages 80 and 82, as illustrated in FIG. 3F. When tungsten plugs are used, passages 80 and 82 are filled with a tungsten and a glue layer of Ti, TiN or both and, subsequently, chemical mechanical polishing is used to establish a planar surface containing tungsten plug contact vias, over which a metal patterned wiring layer can then be formed, as described hereinafter.

After formation of passages of 80 and 82, a metal layer (not shown) is subsequently applied over the entire surface, and mask 56 illustrated in FIG. 2 is applied over this metal layer. The metal layer is then etched so that patterned wiring layer 32 illustrated in FIG. 1 results, which patterned wiring includes contact terminals connected to the bottom electrode 18 by the contact via 28 and the top electrode 24 by the contact via 30.

Figure 4:
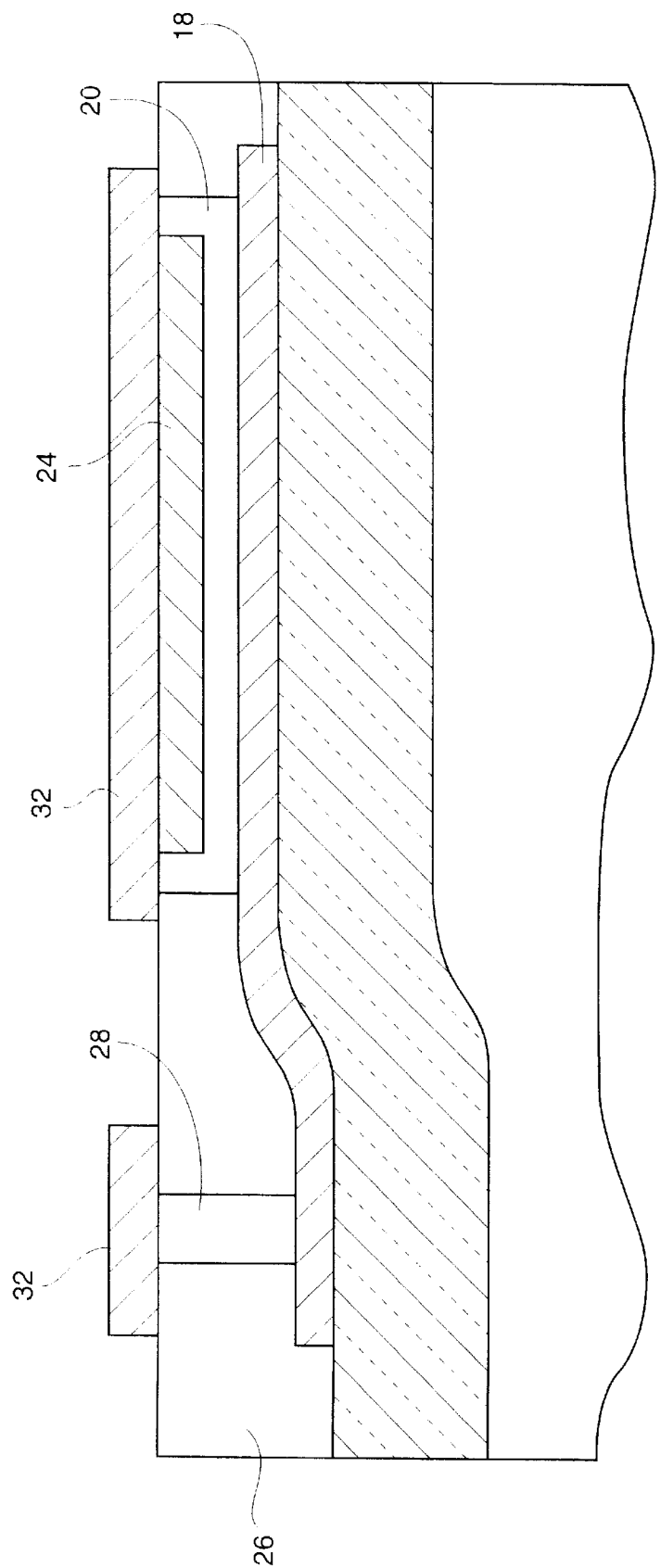
FIG. 4 illustrates a cross sectional view of another embodiment of the integrated circuit capacitor according to the present invention.

FIG. 4 illustrates a modification of the embodiment illustrated in FIG. 1 in which the insulator layer 78 illustrated in FIG. 3F is not applied. As a result, only a single contact via 28 is required.

Figure 5:
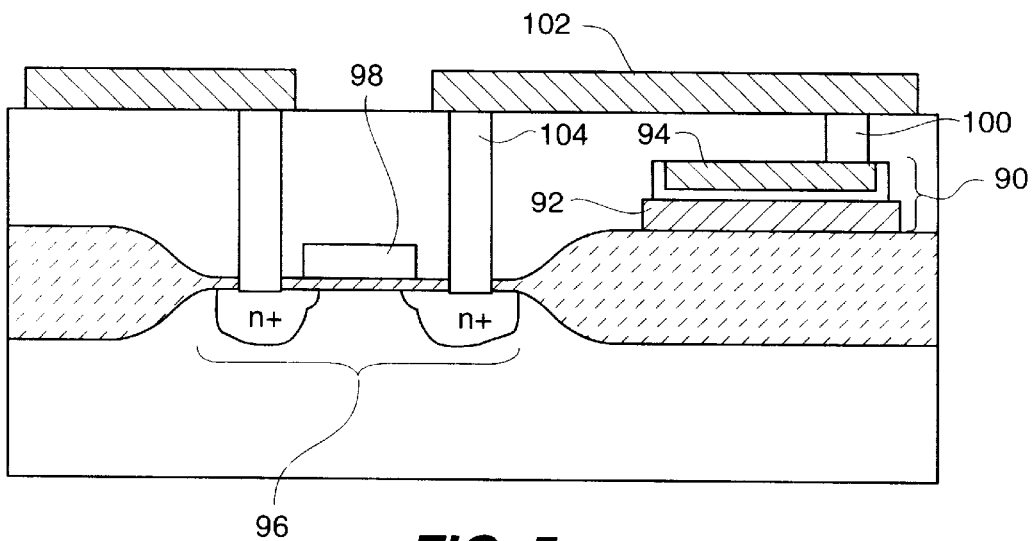
FIG. 5 illustrates a cross sectional view of the integrated circuit capacitor according to the present invention connected to another circuit device disposed within the integrated circuit chip.

FIGS. 5 illustrates the integrated circuit capacitor according to the present invention connected to another circuit device disposed within the semiconductor chip. FIG. 5 illustrates capacitor 90 connected to a MOS transistor 92. Capacitor 90 contains a bottom electrode 92 made of polysilicon, which is made at the same time and using the same mask as is used to make the polysilicon gate electrode 98 of MOS transistor 92. Top electrode 94 is also made of a polysilicon or metal material and fabricated as described previously. As illustrated, top electrode 94 connects to the source/drain of transistor 96 by the electrical path that includes contact via 100, patterned wiring 102 and contact via 104, each of which are preferably made according to the process described previously. A contact via to layer 92 has not been illustrated.

Figure 6:
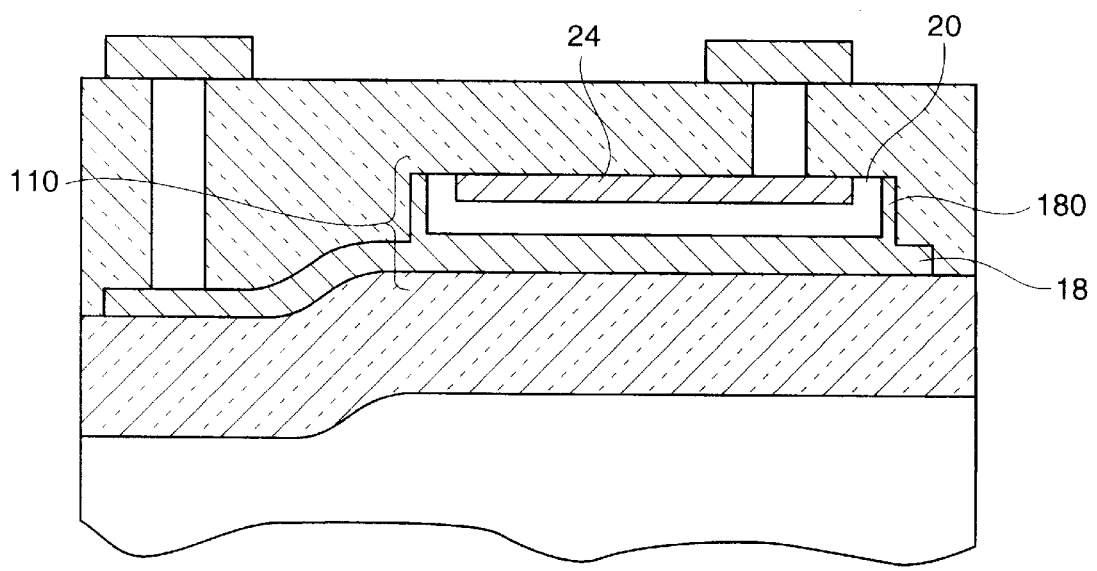
FIG. 6 illustrates a cross sectional view of another embodiment of the integrated circuit capacitor according to the present invention.

FIG. 6 illustrates a further modification of the integrated circuit capacitor previously described with reference to FIG. 1. In this embodiment, capacitor 110 includes a bottom electrode 18 that contains a sidewall portion 18B that is disposed along the outer periphery of the dielectric 20. The same material is preferably used to make the whole bottom electrode 18, although an additional process step, not needed to manufacture the capacitor illustrated in FIG. 1, is required. Specifically, after formation of opening 72 previously described with reference to FIG. 3C, the first material deposited will be a conductive layer made of the same material as the previously deposited material used to make the lower portion of bottom electrode 18. Thereafter, the remaining process steps are the same. This modification results in the structure illustrated in FIG. 6, which has an increased effective capacitor area due to the presence of sidewall 18B of the bottom electrode 18.

Figure 7A:
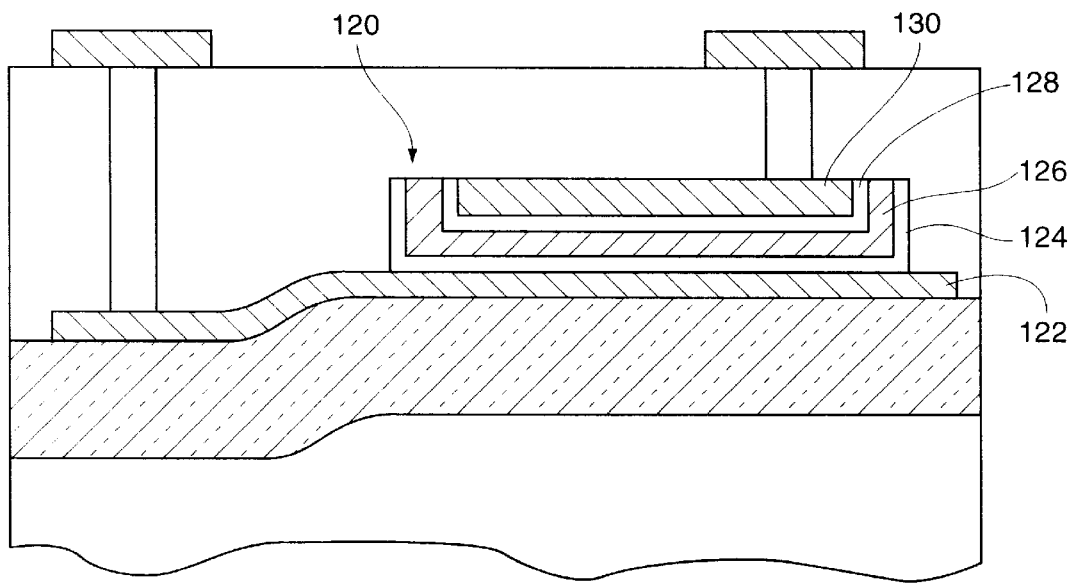
FIGS. 7A and 7B illustrate cross sectional views of different embodiments of a floating gate circuit device according to the present invention.

FIG. 7A illustrates another semiconductor device that can be fabricated according to the present invention. As illustrated, the floating gate device 120 contains a bottom electrode 122, a tunnelling oxide 124, a floating electrode 126, another tunnelling oxide 128 and a top electrode 130. Additional and different process steps than those described with reference to the capacitor 12 of FIG. 1 previously described include the use of a tunnelling oxide, preferably an oxide, $SiN_4$, or an oxide sandwich, rather than the dielectric material used as the dielectric 20 of the capacitor 12 of FIG. 1. Further, after formation of opening 72 as previously described with reference to FIG. 3C, layers which will correspond to each of tunnelling oxide 124, floating electrode 126, tunnelling oxide 128 and top electrode 130 are sequentially deposited prior to the use of an etch that is preferably the chemical-mechanical polishing described previously with reference to FIG. 3E. The thickness of each of the above described layers will vary according to the described electrical characteristics, but are typically about 80 Angstroms for the tunneling oxides and 2,000 to 7,000 Angstroms for the electrodes. Further, a silicon nitride layer can be used as the floating electrode 126. With the process modified as indicated above, the floating gate device 120 of FIG. 7 will result.

Figure 7B:
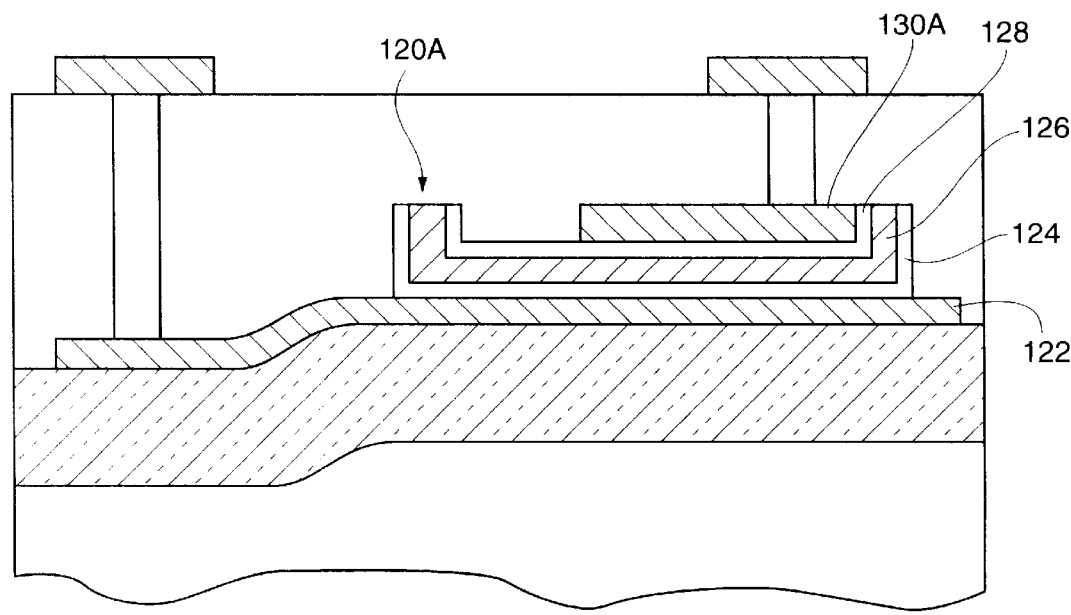

FIG. 7B illustrates another embodiment of another floating gate device 120A that is similar to that of floating gate device 120 illustrated in FIG. 7A, but differently contains a top electrode 130A that has a reduced size as compared to top electrode 130 in the FIG. 7A embodiment. Although fabrication of top electrode 130A requires the use of an additional mask, it allows for further control of the tunneling characteristics due the change in the area ratios of between the capacitor formed with dielectric layer 128 and the capacitor formed with dielectric layer 124, since, if the thickness of dielectric layers 124 and 128 are equal, the highest field will appear on the smallest area of the tunnel capacitor.

Figure 8:
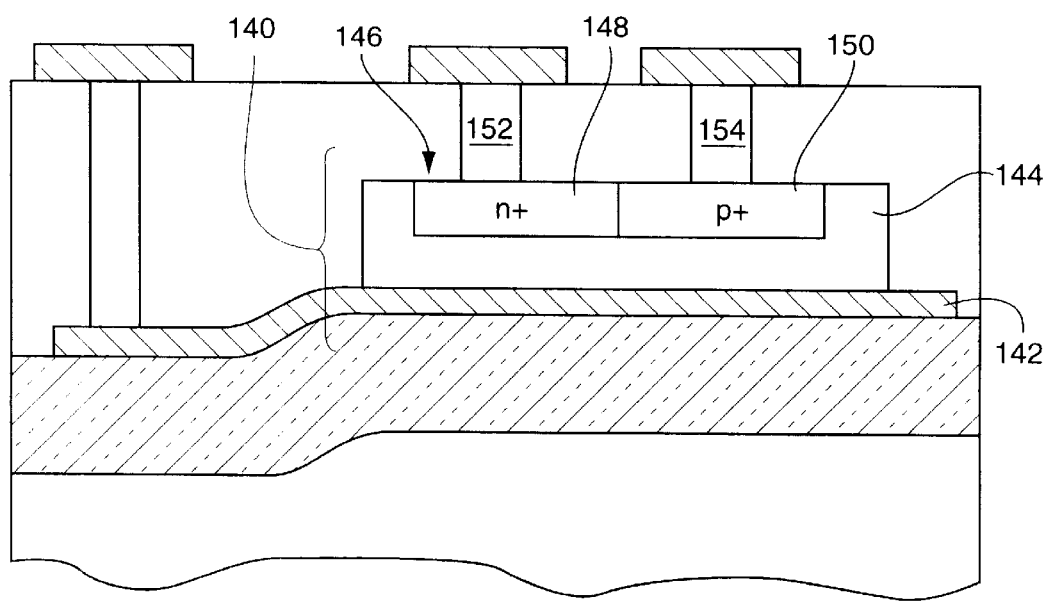
FIG. 8 illustrates a cross sectional view of an abrupt junction polysilicon diode integrated circuit device according to the present invention.

FIG. 8 illustrates another semiconductor device that can be fabricated according to the present invention. As illustrated, the polysilicon diode device 140 contains a bottom electrode 142, a dielectric layer 144 and a diode 146 formed from a n+ material region 148 and a p+ material region 150. Manufacture of this device is essentially the same as that described with reference to the capacitor 12 of FIG. 1, except for an additional step(s) of doping portions of what is designated the top electrode 24 illustrated in FIG. 1 to obtain the diode 146. Doping of n+ material region 148 and p+ material region 150 will require at one additional mask step with a mask that covers one of n+ material region 148 and p+ material region 150 so that the other region can be formed. Further, contact vias 152 and 154, each connected with one of n+ material region 148 and a p+ material region 150 are required, rather than the single contact via 30 that is used with the capacitor 12 illustrated in FIG. 1.

Figure 9:
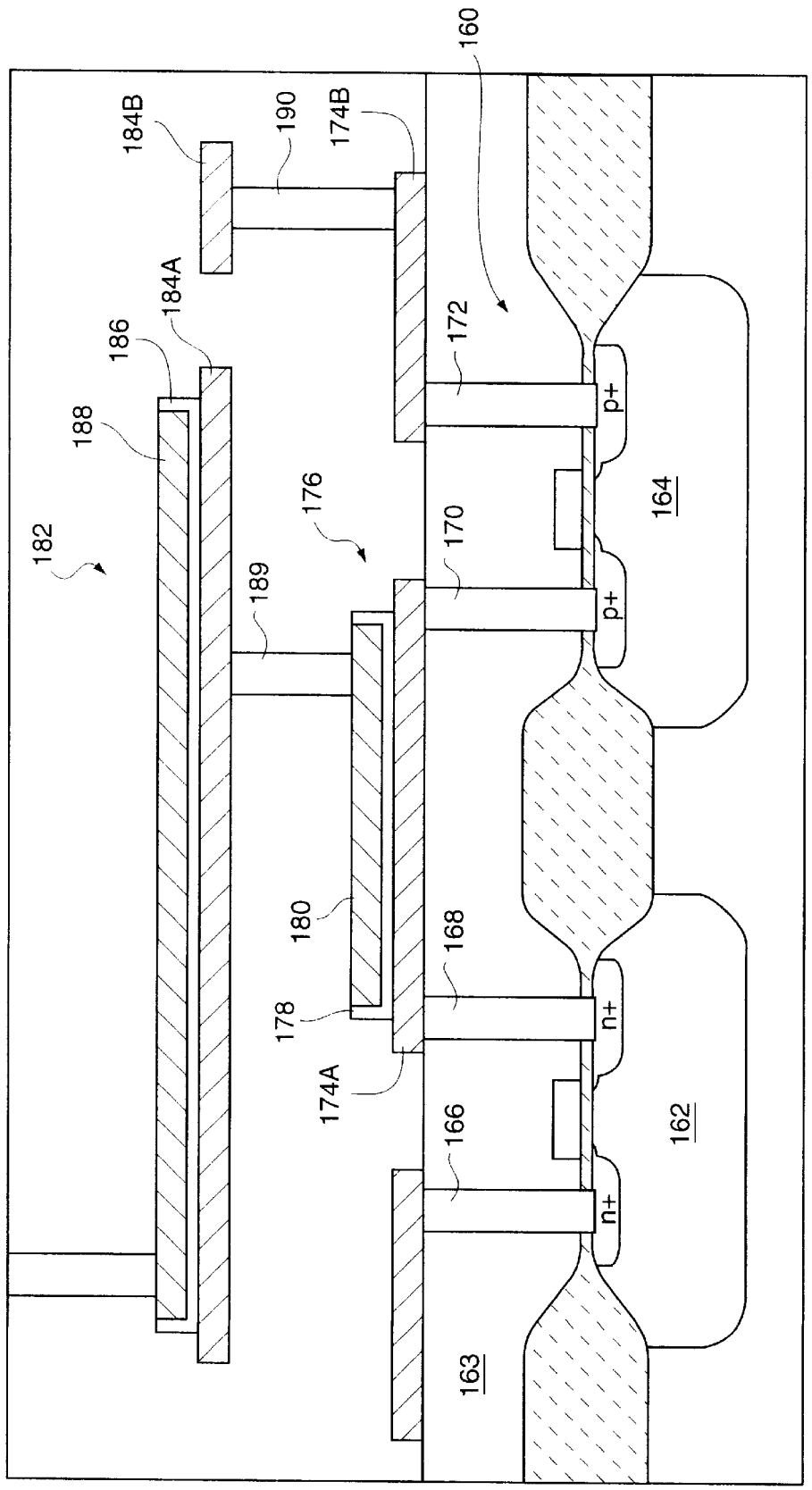
FIG. 9 illustrates a cross sectional view of integrated circuit capacitors according to the present invention formed on different levels and connected to other circuit devices that form part of the integrated circuit chip.

FIG. 9 illustrates integrated circuit capacitors according to the present invention formed on different levels and connected to other circuit devices that form part of the integrated circuit chip. In the example illustrated, a CMOS inverter 160 containing an NMOS transistor 162 and a PMOS transistor 164 is connected to multi-level integrated circuit capacitors of the present invention.

Contact vias 166, 168, 170 and 172 are formed in insulator 163 prior to the formation of a patterned wiring layer 174 that will include the bottom electrode 174A of a capacitor 176 formed according to the present invention as previously described so that a dielectric 178 and a top electrode 180 are also obtained. After formation of capacitor 176, another capacitor 182 is formed having a bottom electrode 184A which is part of a patterned wiring layer 184, a dielectric 186 and a top electrode 188. A passage for formation of contact via 189 is established prior to formation of patterned wiring layer 180 so that top electrode 180 of capacitor 176 connects to the bottom electrode 184A of capacitor 182. It should also be noted that, as each layer is added, contact vias such as contact via 190 and wiring paths such as conductive paths 174B and 184B are also formed so that desired connections of different devices can be obtained. Steps subsequent to the formation of the multi-level capacitors use the same process steps previously described and such will not be repeated.

FIG. 9 also illustrates that the bottom electrode 174A and conductive path 174B are formed after global planarization of the insulator 163. This produces a flat bottom surface on which many bottom electrodes can be formed, if desired. Thus, the area of the bottom electrodes can be well controlled and not dependent on the underlying topology. This allows for accurate matching of capacitors.

FIGS. 10A and 10B, and FIGS. 11A and 11B, respectively illustrate series and parallel connections of capacitors that are formed according to the present invention.

FIGS. 10A and 10B illustrate capacitors 200, 202 and 204, which are connected in series using contact vias 206 and 208, with terminals 210 and 212, each having an associated contact via 210A and 212A, being formed so that a voltage divider is obtained. For this structure, each of the capacitors 200, 202 and 204 are formed on a different level of the semiconductor chip. It should be noted that each of these capacitors are offset from the capacitor below so that appropriate connections using contact vias and patterned wiring can be established, although this specific offset scheme is not required if one considers wiring that is orthogonal to the plane of the paper of the drawing figures.

FIGS. 11A and 11B illustrate capacitors 220, 222 and 224, which are connected in parallel using contact vias 226 and 228, with terminal 230, formed from contact vias 230 A–E and patterned wiring conductors 230 F–H. It is again noted that each of these capacitors are offset from the capacitor below so that appropriate connections using contact vias and patterned wiring can be established, although this specific offset scheme is not required if one considers wiring that is orthogonal to the plane of the paper of the drawing figures. Further, while the electrical connection between different levels can use a single single contact via 210A, as illustrated in FIG. 10A, stacked vias, as illustrated by vias 230A, 230B and 230D in FIG. 11A can also be used.

While the invention has been described in connection with what is presently considered to be the most practical and preferred embodiments, it is understood that the invention is not limited to the disclosed embodiment. For example, more than one capacitor can be formed on a semiconductor or dielectric layer. Accordingly, the present invention is intended to cover various modifications and equivalent arrangements included within the spirit and scope of the appended claims.

What is claimed is:

1. An integrated circuit capacitor formed on a surface comprising:
    a bottom electrode formed on said surface;
    a dielectric layer formed over said bottom electrode, said dielectric layer including a peripheral region with a greater height than a central region;
    a top electrode formed over said central region of said dielectric layer and within said peripheral region of said dielectric layer;
    a first contact via electrically connected to said bottom electrode; and
    wherein said bottom electrode has a larger area than said dielectric layer so that an area exists to establish contact with said first contact via.

2. An integrated circuit capacitor according to claim 1 wherein said bottom electrode is polysilicon and said top electrode is metal.

3. An integrated circuit capacitor according to claim 1 wherein said bottom electrode is metal and said top electrode is polysilicon.

4. An integrated circuit capacitor according to claim 1 wherein said top and bottom electrodes are polysilicon.

5. An integrated circuit capacitor according to claim 1 wherein said dielectric layer includes a plurality of different dielectric layers.

6. An integrated circuit capacitor according to claim 1 wherein said bottom electrode includes a peripheral portion formed on an outer sidewall of said peripheral region of said dielectric layer.

7. An integrated circuit capacitor according to claim 1 further including:
    a patterned wiring layer disposed over said top electrode; and
    said first contact via electrically connects said bottom electrode to said patterned wiring layer.

8. An integrated circuit capacitor according to claim 7 further including:
    an insulator disposed between said patterned wiring layer and said top electrode; and
    a second contact via which electrically connects said top electrode to said patterned wiring layer.

9. An integrated circuit according to claim 7 wherein said first contact via is disposed above said bottom electrode.

10. An integrated circuit capacitor according to claim 1 wherein said surface is an insulator disposed over a substrate.

11. An integrated circuit according to claim 1 wherein said first contact via is disposed above said bottom electrode.

12. An integrated circuit comprising:
    a surface;
    a first capacitor formed over said surface, said first capacitor including:
        a first bottom electrode formed on said surface;
        a first dielectric layer formed over said first bottom electrode, said first dielectric layer including a first peripheral region with a greater height than a first central region; and
        a first top electrode formed over said first central region of said first dielectric layer and between said first peripheral region of said first dielectric layer;
    an insulator disposed over said first top electrode; and
    a second capacitor formed over said insulator, said second capacitor including:
        a second bottom electrode formed on said insulator:
            second dielectric layer formed over said second bottom electrode, said second dielectric layer including a second peripheral region with a greater height than a second central region; and
        a second top electrode formed over said second central region of said second dielectric layer and between said second peripheral region of said second dielectric layer.

13. An integrated circuit according to claim 12 further including a contact via disposed between said first top electrode and said second bottom electrode so that said first and second capacitors are connected in series.

14. An integrated circuit according to claim 13 further including:
    a patterned wiring layer disposed over said second top electrode; and
    a second contact which electrically connects said second top electrode to said patterned wiring layer.

15. An integrated circuit according to claim 14 further including:
    an insulator disposed between said patterned wiring layer and said second top electrode; and
    a third contact via which electrically connects said second top electrode to said patterned wiring layer.

16. An integrated circuit according to claim 13 wherein said second capacitor is formed directly over said first capacitor.

17. An integrated circuit according to claim 13 wherein said second capacitor is not formed over a part of said first top electrode.

18. An integrated circuit according to claim 12 further including:
- a first contact via disposed between said first bottom electrode and said second bottom electrode;
- a second contact via disposed above said first bottom electrode so that said first and second top electrodes are capable of being electrically connected together so that said first and second capacitors can be connected in parallel.

19. An integrated circuit according to claim 18 further including:
- a second insulator disposed above said second top conductive layer;
- a conductive layer disposed over a portion of said second insulator;
- wherein said second contact via electrically connects said first top electrode to said conductive layer; and
- a third contact via electrically connects said second top electrode to said conductive layer so that said first and second capacitors are connected in parallel.

20. An integrated circuit according to claim 18 wherein said first dielectric layer has a smaller area than said first bottom electrode and there exists a first portion of a top surface of said first bottom electrode not covered by said first dielectric layer, said first contact via electrically connecting said second bottom electrode to said first bottom electrode at said first portion of said first bottom electrode.

21. An integrated circuit according to claim 20 wherein said second dielectric layer has a smaller area than said second bottom electrode.

22. An integrated circuit according to claim 21 wherein said second dielectric layer has a smaller area than said second bottom electrode and there exists a second portion of a top surface of said second bottom electrode not covered by said second dielectric layer, said first contact via electrically connecting said second bottom electrode to said first bottom electrode at said second portion of said second bottom electrode.

23. An integrated circuit according to claim 22 wherein said second capacitor is not formed over a part of said first top electrode and said second contact via is connected to said first top electrode at said part.

24. An integrated circuit according to claim 12 wherein said first dielectric layer has a smaller area than said first bottom electrode.

25. An integrated circuit according to claim 24 wherein said second dielectric layer has a smaller area than said second bottom electrode.

* * * * *